US011876509B1

United States Patent
Zeng et al.

(10) Patent No.: US 11,876,509 B1
(45) Date of Patent: Jan. 16, 2024

(54) GATE CONTROL METHOD OF MOS-GATED POWER DEVICE

(71) Applicant: Infineon Technologies AG, Neubiberg (DE)

(72) Inventors: Guang Zeng, Haar (DE); Franz-Josef Niedernostheide, Hagen am Teutoburger Wald (DE); Mark-Matthias Bakran, Erlangen (DE); Zheming Li, Bayreuth (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/875,876

(22) Filed: Jul. 28, 2022

(51) Int. Cl.
H03K 17/00 (2006.01)
H03K 17/16 (2006.01)
H03K 17/687 (2006.01)

(52) U.S. Cl.
CPC ......... H03K 17/166 (2013.01); H03K 17/168 (2013.01); H03K 17/687 (2013.01); H03K 2217/0027 (2013.01)

(58) Field of Classification Search
CPC ... H03K 17/166; H03K 17/168; H03K 17/687
See application file for complete search history.

(56) References Cited

U.S. PATENT DOCUMENTS

| | | | |
|---|---|---|---|
| 7,466,458 B2* | 12/2008 | Cheng | H04N 1/401 358/461 |
| 2007/0070567 A1* | 3/2007 | Bayerer | H03K 17/0422 361/100 |
| 2009/0040796 A1* | 2/2009 | Lalithambika | H03K 17/0406 363/56.09 |
| 2018/0183228 A1* | 6/2018 | Huber | H03K 17/0828 |
| 2018/0198442 A1* | 7/2018 | Hokazono | H03K 17/08128 |
| 2020/0228109 A1* | 7/2020 | Bachhuber | H03K 17/0822 |

OTHER PUBLICATIONS

Bohlländer, Marco, et al. "Desaturated Switching of Trench—Fieldstop IGBTs." pp. 1-6. 2006. chrome-extension:// bemmndcbldboiebfnladdacbdfmadadm/https://www.researchgate. net/profile/Reinhold-Bayerer/publication/274456146_Desaturated_ Switching_of_Trench_-_Fieldstop_IGBTs/links/ 552001020cf2f9c130500f4f/Desaturated-Switching-of-Trench-Fieldstop-IGBTs.pdf?origin=publication_detail.

Henn, Jochen et al. "Design of Sensors for Real-Time Active Electromagnetic-Emission Control in SiC Traction Inverters," PCIM Europe digital days 2021. 2021. pp. 1-7.

Miyoshi, Tomoyuki et al. "Dual Side-Gate HiGT Breaking Through the Limitation of IGBT Loss Reduction." PCIM Europe 2017. 2017. pp. 1-8.

(Continued)

Primary Examiner — Tuan T Lam
(74) Attorney, Agent, or Firm — Harrity & Harrity, LLP

(57) ABSTRACT

A method of driving a transistor between switching states includes controlling a transition of a gate voltage at a gate terminal of a transistor during each of a plurality of turn-off switching events to turn off the transistor, wherein the transistor is configured to be turned off according to a desaturation time during each of the plurality of turn-off switching events; measuring a transistor parameter indicative of a voltage slew rate of the transistor for a first turn-off switching event during which the transistor is transitioned from an on state to an off state; and regulating a duration of the desaturation time for a next turn-off switching event based on the measured transistor parameter.

25 Claims, 7 Drawing Sheets

(56) References Cited

OTHER PUBLICATIONS

Mori, Mutsuhiro et al. "An innovative silicon power device (i-Si) through time and space control of a stored carrier (TASC)." 2018 IEEE 30th International Symposium on Power Semiconductor Devices and ICs (ISPSD). 2018. pp. 520-523. doi: 10.1109/ISPSD.2018.8393717.

Tzelepis, Dimitrios et al. "Voltage and Current Measuring Technologies for High Voltage Direct Current Supergrids: A Technology Review Identifying the Options for Protection, Fault Location and Automation Applications." IEEE Access. vol. 8. pp. 203398-203428. 2020. doi: 10.1109/ACCESS.2020.3035905.

Zhao, Shuang et al. "A Review of Switching Slew Rate Control for Silicon Carbide Devices Using Active Gate Drivers." in IEEE Journal of Emerging and Selected Topics in Power Electronics. vol. 9. No. 4. pp. 4096-4114. Aug. 2021. doi: 10.1109/JESTPE.2020.3008344.

\* cited by examiner

GATE CONTROL METHOD OF MOS-GATED POWER DEVICE

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device (e.g., a power transistor) usually comprises a semiconductor structure configured to conduct a load current along a load current path between two load terminal structures of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state and a blocking state. Accordingly, the power semiconductor device behaves like a switch with on and off states (i.e., conducting and blocking states, respectively).

IGBTs combine the principle of a bipolar transistor with a wattless driving of a MOSFET. An electron current is conducted via a lateral or vertical MOS channel for driving the IGBT. This electron current leads to the injection of holes from a pn junction formed at a rear of the IGBT and polarized in the forward direction. As a result, the low conductivity of a voltage-accepting layer can be increased by several orders of magnitude in the turned-on state of the IGBT by injecting an electron hole plasma. When the IGBT is turned off, however, this conductive plasma must be removed from the active zone which is bound to lead to turn-off losses since, during a voltage rise between emitter and collector of the IGBT, a depletion current or part-current for removing the electron hole plasma continues to flow. Desaturation produces a reduction in the charge carrier concentrations of electrons and holes within the IGBT. In other words, the transistor is desaturated by the removal of the electron hole plasma from the active region of the device. The higher the plasma density, the more desaturation time is needed to desaturation the device.

With the development of devices towards low conduction loss, the cell density and transconductance are increasing which leads to a drastically increased plasma density during the conduction and increased switching loss at the turn-off. Advanced gate control techniques of MOS-gated power devices like "desaturation pulse", "dual gate IGBT", or "MOS-controlled diode" could help to improve the trade-off between conduction loss and switching loss. The total power losses during one turn-off event could be minimized by choosing an optimized desaturation time during which desaturation is carried out.

The desaturation time is only optimized for one operating point or operating condition of a power transistor. An operating point depends on the following parameters: the applied DC-Link voltage VDC, collector current $I_C$, and the junction temperature of the power transistor. Thus, a specific VDC, collector current $I_C$, and the junction temperature corresponds to one operating point, whereas a different combination of VDC, collector current $I_C$, and the junction temperature corresponds to a different operating point. For other operating points or operation conditions, the desaturation time may vary significantly. However, the desaturation time is usually set to be constant based on the experimental evaluation at the nominal operation condition like rated current, rated DC link voltage, and junction temperature Tj=150° C. In other words, the desaturation time is set to a fixed value among all operating points. This leads to inefficiencies and conduction losses since, for lower junction temperatures or lower load currents, the plasma density of the MOS-gated bipolar power devices is lower, which needs a shorter desaturation time to reach the optimum operation condition. Conversely, for higher junction temperatures or higher load currents, the plasma density of the MOS-gated bipolar power devices is higher, which needs a longer desaturation time to reach the optimum operation condition. In addition, in applications with different commutation circuit stray inductance or gate inductance, the optimum desaturation time could also vary. Furthermore, the device parameter variation due to manufacturing variation like for example chip thickness variation could also lead to different optimum desaturation time for different devices. A single optimum desaturation time for a single operating point based on a limited number of devices is not applicable for all devices under all application conditions. If the desaturation time is not set appropriately, it will lead to either too high losses or too high dv/dt, which is harmful for the power semiconductor device.

Accordingly, it may be desirable to optimize the switching process of a power semiconductor device, such as a power transistor, by automatically varying the desaturation time for varying operating conditions of real applications to achieve an optimized desaturation time for any operating condition. The optimum trade-off between conduction losses and switching losses can be realized across the full operating range of the corresponding applications.

SUMMARY

One or more embodiments provide a gate driver system including: a transistor configured to be driven between switching states; a gate driver circuit coupled to a gate terminal of the transistor and configured to control a gate voltage at the gate terminal in order to drive the transistor between the switching states, wherein the gate driver circuit is configured to generate a gate control signal that controls the gate voltage during each of a plurality of turn-off switching events to turn off the transistor, wherein the transistor is configured to be turned off according to a desaturation time during each of the plurality of turn-off switching events; a measurement circuit configured to measure a transistor parameter indicative of a voltage slew rate of the transistor for a first turn-off switching event during which the transistor is transitioned from an on state to an off state; and a control circuit configured to receive the measured transistor parameter and regulate a duration of the desaturation time based on the measured transistor parameter.

One or more embodiments provide a gate driver system including: a transistor configured to be driven between switching states wherein the transistor is configured to be turned off during each of a plurality of switching events; a gate-controlled freewheeling diode coupled antiparallel to the transistor, wherein the gate-controlled freewheeling diode is configured to be turned on during each of the plurality of switching events; a gate driver circuit coupled to a first gate terminal of the transistor and to a second gate terminal of the gate-controlled freewheeling diode, wherein the gate driver circuit is configured to control a first gate voltage at the first gate terminal in order to drive the transistor between the switching states, wherein the gate driver circuit is configured to trigger a first transition of the first gate voltage from a first voltage level to a second voltage level during each of the plurality of switching events at a first trigger time, wherein the second voltage level is less than the first voltage level, wherein the gate driver circuit is configured to control a second gate voltage at the second gate terminal in order to drive the gate-controlled freewheeling diode between conduction states, wherein the gate driver circuit is configured to trigger a second transition of the second gate voltage from a third voltage level to a fourth voltage level during each of the plurality of switching events at a second trigger time, wherein the fourth voltage level is greater than the third voltage level, and wherein the second trigger time is offset prior to the first trigger time by a desaturation time; a measurement circuit configured to measure a transistor parameter indicative of a voltage slew rate of the transistor for a first turn-off switching event during which the transistor is transitioned from an on state to an off state; and a control circuit configured to receive the measured transistor parameter and regulate a duration of the desaturation time based on the measured transistor parameter.

One or more embodiments provide a gate driver system including: a half bridge circuit including a first transistor and a second transistor, wherein the first transistor is configured to be turned on and the second transistor is configured to be turned off during each of a plurality of switching events; a gate-controlled freewheeling diode coupled antiparallel to the second transistor, wherein the gate-controlled freewheeling diode is configured to be turned on during each of the plurality of switching events; a gate driver circuit coupled to a first gate terminal of the second transistor and to a second gate terminal of the gate-controlled freewheeling diode, wherein the gate driver circuit is configured to control a first gate voltage at the first gate terminal in order to drive the second transistor between the switching states, wherein the gate driver circuit is configured to trigger a first transition of the first gate voltage from a first voltage level to a second voltage level during each of the plurality of switching events at a first trigger time, wherein the second voltage level is less than the first voltage level, wherein the gate driver circuit is configured to control a second gate voltage at the second gate terminal in order to drive the gate-controlled freewheeling diode between conduction states, wherein the gate driver circuit is configured to trigger a second transition of the second gate voltage from a third voltage level to a fourth voltage level during each of the plurality of switching events at a second trigger time, wherein the fourth voltage level is greater than the third voltage level, and wherein the second trigger time is offset prior to the first trigger time by a desaturation time; a measurement circuit configured to measure a transistor parameter indicative of a voltage slew rate of the first transistor for a first switching event during which the first transistor is transitioned from an off state to an on state; and a control circuit configured to receive the measured transistor parameter and regulate a duration of the desaturation time based on the measured transistor parameter.

One or more embodiments provide a method of driving a transistor between switching states. The method includes controlling a transition of a gate voltage at a gate terminal of a transistor during each of a plurality of turn-off switching events to turn off the transistor, wherein the transistor is configured to be turned off according to a desaturation time during each of the plurality of turn-off switching events; measuring a transistor parameter indicative of a voltage slew rate of the transistor for a first turn-off switching event during which the transistor is transitioned from an on state to an off state; and regulating a duration of the desaturation time for a next turn-off switching event based on the measured transistor parameter.

BRIEF DESCRIPTION OF THE DRAWINGS

Embodiments are described herein making reference to the appended drawings.

DETAILED DESCRIPTION

Figure 1:
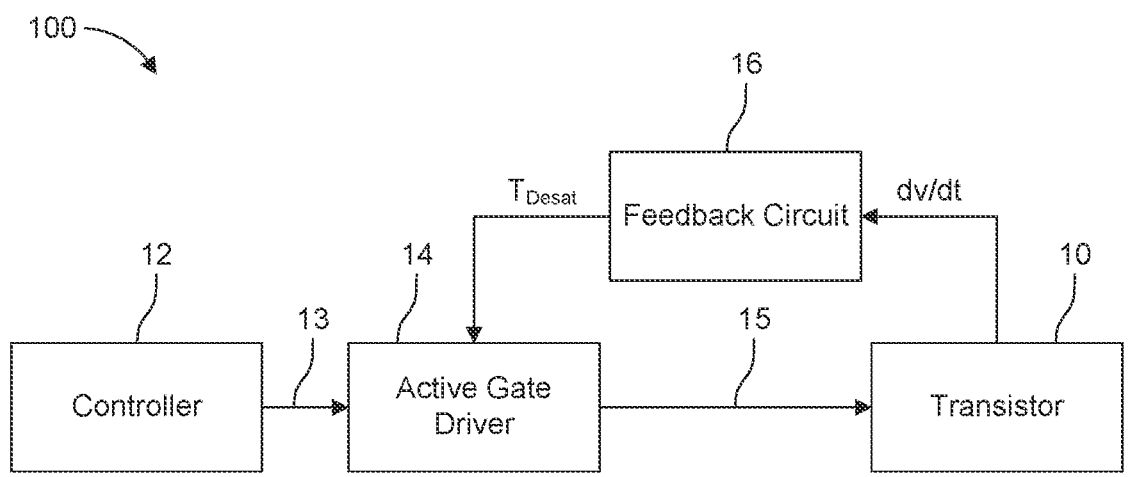
FIG. 1 is a schematic block diagram of a gate driver system with desaturation control according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable gate arrays (FPGAs) or other field programmable logic arrays, programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure. A controller may be, for example, a microcontroller, an FPGA, or a PLC, or other equivalent integrated or discrete logic circuitry. It may include any one of the above-noted processors or other equivalent integrated or discrete logic circuitry.

A signal processing circuit and/or a signal conditioning circuit may receive one or more signals (i.e., measurement signals) from one or more components in the form of raw measurement data and may derive, from the measurement signal further information. A signal processing circuit may include one or more processors or vice versa. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies, power modules, and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value.

For example, the gate-source voltage Vgs of a MOSFET is typically driven down to 0V or to a negative voltage to turn off the device and is typically driven to a maximum value for the technology (e.g., 3.3V) to fully turn on the device. The threshold voltage (Vth) of a MOSFET needed to create a conducting path between load terminals is between these two Vgs voltage levels. For this reason, the gate-source voltage Vgs of a MOSFET may be referred to as a control voltage. Accordingly, the MOSFET behaves like a switch with on and off states (i.e., conducting and blocking states, respectively).

Similarly, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off, referred to turn-on switching events and turn-off switching events, respectively. Thus, a power transistor can also be referred to as a power switch or a transistor switch that may be used to drive a load current.

The gate of a power transistor is a capacitive load that can be charged and discharged to modulate the gate voltage. A voltage pulse may be output from the gate driver as the control signal according to a pulse width modulation (PWM) scheme. Thus, the control signal may be switched between an ON voltage level (e.g., VH) and an OFF voltage level (VL) during a PWM cycle for controlling a power transistor. This in turn charges and discharges the gate voltage to turn on and off the power transistor, respectively.

Alternatively, the gate driver may use sourced and sinked currents as control signals to turn the power transistor on and off. For example, during the turn-on process, the gate driver may provide (soured) an ON current to the gate of the power transistor in order to charge the gate to a sufficient voltage to turn on the device. In contrast, during the turn-off process, the gate driver IC is used to draw (sink) an OFF current from the gate of the power transistor in order to discharge the gate voltage to a sufficient voltage to turn off the device. During a turn OFF event, after some small amount of time (small compared to the PWM period), the gate current decreases and reaches a zero value when the gate reaches approximately 0V or a negative driving value. During a turn ON event, after some small amount of time (small compared to the PWM period), the gate current decreases and reaches a zero value when the gate reaches the high side supply level.

Transistors may include Insulated Gate Bipolar Transistors (IGBTs) and Metal Oxide Semiconductor Field Effect Transistors (MOSFETs) (e.g., Si MOSFETs or SiC MOSFETs). It will be appreciated that MOSFETs may be substituted for IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage VDS may be substituted for the IGBT's collector-emitter voltage VCE in any one of the examples described herein. Thus, any IGBT module may be substituted by a MOSFET module and vice versa. An IGBT is a power transistor that combines an input MOSFET and an output bipolar transistor. Accordingly, an IGBT is a MOS-gated power device because it is the gate of the MOSFET that controls the state of the device.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Additionally, transistors which are suitably connected to form half-bridges are commonly used in the field of power electronics. For example, half-bridges comprising a first power transistor and a second, complementary power transistor, may be used for driving electric motors or switched mode power supplies. The first power transistor may be referred to as a high-side transistor and the second power transistor may be referred to as a low-side transistor. A gate driver, used for driving the power switches, is supplied with a fixed positive voltage by a positive supply rail and a fixed negative voltage by a negative supply rail. The positive supply rail is connected to the output pad via the high-side switch to supply load current to a load and the negative supply rail is connected to the output pad via the low-side switch to sink load current from the load. The two complementary power switches are complementary turned ON and OFF to avoid cross-conduction. Thus, the first power transistor, when ON, is responsible for conducting load current in order to source the load current to the load while its complementary power transistor is turned off (i.e., the second power transistor is in blocking mode). In order to sink load current from the load, the roles of the two transistors are reversed. Here, the second power transistor, when ON, is responsible for conducting load current in order to sink the load current from the load while its complementary power transistor is turned off (i.e., the first power transistor is in blocking mode).

FIG. 1 is a schematic block diagram of a gate driver system 100 with desaturation control according to one or more embodiments. The gate driver system 100 includes a power transistor 10, control circuitry, and gate driver circuitry that implements a scheme for desaturation control of the power transistor 10 during turn-off. In particular, different desaturation times Tdesat can be implemented for turn-off of the power transistor 10 (i.e., during a switching transition). The power transistor may be implemented as either a low-side transistor or a high-side transistor in a half-bridge circuit. Moreover, for a half-bridge circuit, the gate driver system 100 can be provided in duplicate, where the gate driver system 100 is provided for both high-side and low-side transistors.

The gate driver system 100 includes a power transistor 10, a controller 12, an active gate driver 14, and feedback circuit 16. The power transistor 10 is a MOS-gated power device. The controller 12 may be a microcontroller that generates a control signal 13 for controlling a switching state of the transistor 10. For example, the control signal 13 may be a pulse-width modulation (PWM) control signal that provides switch-on and switch-off commands to the active gate driver 14. Alternatively, the control signal 13 may represent one of two separate control signals, including one switch-on control signal and one switch-off control signal. As used herein, the term "switch-on" may be used interchangeably with the term "turn-on" when referring to switching on a transistor. Similarly, as used herein, the term "switch-off" may be used interchangeably with the term "turn-off" when referring to switching off a transistor.

The feedback circuit 16 may include a measurement circuit that measures the voltage slew rate dv/dt of the power transistor 10 or a signal correlating to dv/dt during its turn off transient and an evaluation circuit that evaluates the voltage slew rate dv/dt and controls a duration of the desaturation time Tdesat implemented by the gate driver 14 for the next turn off event based on the measured voltage slew rate dv/dt. In other words, the dv/dt measurement for the current turn off event is used to regulate the desaturation time Tdesat for the next turn off event. It will be appreciated that the evaluation circuit may be integrated into the gate driver 14 itself or the controller 12 or may be a separate processing circuit that may include a comparator (e.g., for comparing the voltage slew rate dv/dt to a threshold) and a processor for determining the desaturation time Tdesat based on the comparison result.

Here, the slew rate may refer to the slope of the collector-emitter voltage VCE of the power transistor. It will also be appreciated that the slew rate may refer to the slope of the collector current is such that the slew rate referred to as di/dt. The collector current may be referred to as a load current and the collector-emitter voltage VCE may be referred to as a voltage across the load terminals of a transistor. Thus, the feedback circuit 16 controls the desaturation time Tdesat based on the slew rate measurement measured during turn off.

In one example, the control signal 13 for changing the switching state of the transistor 10 is processed by the gate driver 14. The gate driver 14 may include a fast FPGA, microprocessor, or other gate driver controller that controls the gate driver stages of the gate driver 14. Based on the control signal 13, the gate driver 14 generates driver control signals that control one of its respective drivers. Thus, the turn-on and turn-off functionality for transistor 10 driven by the drivers can be activated and deactivated according to these driver control signals. Moreover, the gate driver 14 may control one or more additional components according to the determined desaturation time Tdesat.

The active gate driver 14 generates one or more gate control signals 15 based on the control signal 13 received from the controller 12 and based on the desaturation time Tdesat determined by the feedback circuit 16. For example, the active gate driver 14 may generate a voltage signal as a gate control signal 15 that is modulated between two voltage levels VH and VL in order to regulate the charging or the discharging of the gate. Alternatively, the active gate driver 14 may generate one or more gate control signals 15 as source and sink current signals that are modulated to regulate the charging or the discharging of the gate. By regulating the one or more gate control signals 15 during turn off, the active gate driver 14 can regulate the desaturation time Tdesat such that it is optimized for a current operating point and/or operating condition of the transistor 10. In other words, the desaturation time Tdesat is variable and can be dynamically adjusted based on the measured slew rate.

Figure 2:
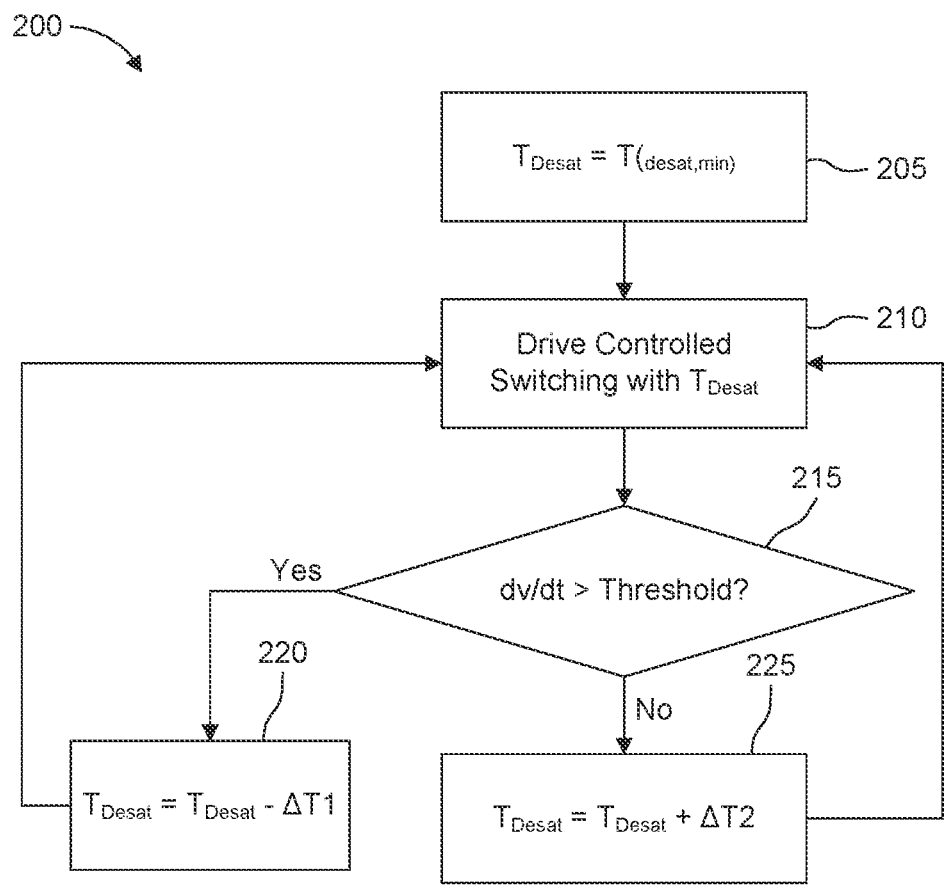
FIG. 2 is a flow diagram for a method of regulating a desaturation time according to one or more embodiments.

FIG. 2 is a flow diagram for a method 200 of regulating a desaturation time Tdesat according to one or more embodiments. Increasing the desaturation time Tdesat also increases the voltage slew rate dv/dt during turn off. Conversely, decreasing the desaturation time Tdesat decreases voltage slew rate dv/dt during turn off. In particular, the voltage slew rate dv/dt of a MOS-gated power device is limited by its corresponding applications, which is for example 6 kV/µs but not limited thereto. A longer desaturation time Tdesat leads to faster switching and higher (steeper) dv/dt, while a shorter desaturation time Tdesat leads to slower switching and lower dv/dt. Accordingly, the voltage slew rate dv/dt and the desaturation time Tdesat have a direct correlation to each other. The optimum desaturation time Tdesat can be determined by the feedback circuit 16 in the following manner.

Before or at system start-up 205, the desaturation time Tdesat may be preset as a low desaturation time T(desat, min), which can ensure that the voltage slew rate dv/dt does not exceed the application limit across the full operating range. If the plasma density of the transistor 10 is at the lowest possible level, this desaturation time Tdesat is directly at the optimum setting. If the plasma density of the transistor 10 is at higher level, meaning a longer desaturation time Tdesat is required, further optimization of the desaturation time Tdesat follows the flowchart shown in FIG. 2.

In operation 210, the gate driver 14 drives the controlled switching for a turn off with the set value for the desaturation time Tdesat. In operation 215, during each turn off switching process, the voltage slew rate dv/dt is measured, processed, and compared with a predefined dv/dt-threshold, which is normally close to the application limit (e.g., 6 kV/µs). The maximum desaturation time Tdesat with a dv/dt of no more than this dv/dt-threshold is defined as the optimum desaturation time Tdesat. The comparison result determined in operation 215 dictates how the desaturation time Tdesat is set for the next turn off switching event (i.e., for the next turn-off switching operation).

If the measured voltage slew rate dv/dt is greater than the dv/dt-threshold, the presently set desaturation time Tdesat exceeds the optimum desaturation time Tdesat time. In this case, the desaturation time Tdesat for use in the next turn-off switching operation is decremented (reduced) by a first adaptation time ΔT1 of a first predetermined amount (operation 220). For example, the desaturation time Tdesat is decreased in this example by 5 ns. On the other hand, if the measured voltage slew rate dv/dt does not cross the dv/dt-threshold (i.e., is equal to or less than the dv/dt-threshold), the presently set desaturation time Tdesat is less than the optimum desaturation time Tdesat time. In this case, the desaturation time Tdesat for use in the next turn-off switching operation is increased by a second adaptation time ΔT2 of a second predetermined amount (operation 225). For example, the desaturation time Tdesat is increased in this example by 5 ns. It will be appreciated that the first predetermined amount ΔT1 and the second predetermined amount ΔT2 may be equal or different amounts. Additionally, a higher adaptation time is conceivable, as is a reduced one.

The process then returns to operation 210, at which the adjusted desaturation time Tdesat is used for the next turn-off switching operation. The voltage slew rate dv/dt is then again measured and compared to the dv/dt-threshold, and the desaturation time Tdesat is adjusted accordingly for a further turn-off switching operation. Thus, the desaturation time Tdesat may be adjusted for each subsequent turn-off switching operation based on the evaluation performed in the turn-off switching operation just prior thereto so that the desaturation time Tdesat can be dynamically regulated according to the real-time operation condition.

It will also be appreciated that, instead of measuring the voltage slew rate dv/dt, the current slew rate di/dt could be measured during the turn off switching operation and compared to a corresponding threshold as a basis of the adjustment to the desaturation time Tdesat. For example, the absolute value of di/dt could be compared to a preset threshold and the desaturation time Tdesat could be adjusted in a similar manner described above.

The control loop of this gate control approach is conducted after the measured turn-off switching operation and before the next turn-off switching operation. Hence, due to sufficient time between two successive turn-off switching operations, regulation of the desaturation time Tdesat can be implemented to have an impact on the performance of the transistor 10. It is assumed that the actual desaturation time Tdesat is maintained within a narrow band around the varying optimum desaturation time Tdesat by this gate control approach.

The method uses a closed-loop control of the gate control signal for a MOS-gated power device. By comparing the actual measured dv/dt value with a pre-defined target (threshold) value, the gate control signal can be continuously optimized for varying operation conditions. Furthermore, this method can automatically apply an accurate and responsive correction to the control function in different applications with respect to device parameter variations. Thus, by implementing this method, not only can the gate driver system 100 automatically optimize gate control parameters for varying operating conditions of real applications, but the optimum trade-off between conduction losses and switching losses can be realized for MOS-gate controlled power devices with respect to device parameter variations.

An advantage to this gate control method is that only the dv/dt-signal needs to be measured. No measurement of operating parameters such as DC-link voltage, load current and junction temperature are necessary and no implementation of a large look-up-table is necessary. Furthermore, the optimum desaturation time is set for the measured device individually based on the corresponding dv/dt measurement result which eliminates the impact of the device parameter variation. Hence, calibration, measuring, and hardware efforts are reduced significantly. Moreover, the control strategy of this gate control approach is simple and low cost. Some or all of the disadvantages of the classical active gate control-based control methods can be overcome. With this gate control approach, the optimum trade-off between switching losses and conduction losses is expected to be realizable for all devices under varying operating conditions in real applications.

In order to implement the closed-loop gate control, measurement of the dv/dt-signal or a signal correlating to dv/dt is needed. The following figures illustrate different types of gate driver systems that include a measurement circuit for measuring the voltage slew rate dv/dt or a signal correlating to dv/dt and a desaturation circuit that regulates one or more gate control signals during turn off according to the determined desaturation time Tdesat. Additionally, corresponding gate control signal diagrams are provided that illustrate the implementation of the regulated desaturation time Tdesat in each application.

While it is possible to measure the actual voltage slew rate dv/dt, it can be simpler to measure a circuit parameter that is directly proportional to the voltage slew rate dv/dt. Thus, in general, a measurement circuit measures the voltage slew rate dv/dt or a parameter (e.g., $\Delta V$) that is directly proportional to the voltage slew rate dv/dt. In the latter case, an evaluation circuit compares the measured parameter to a predetermined threshold to determine the desaturation time Tdesat. Like the dv/dt-threshold used in operation 215, the predetermined threshold is used as a predefined target value for the measured parameter. When the measured parameter exceeds the predetermined threshold, the desaturation time Tdesat is decreased by the first predetermined amount $\Delta T1$ for the next turn off switching operation (e.g., operation 220) and, when the measured parameter does not exceed the predetermined threshold, the desaturation time Tdesat is increased by the second predetermined amount $\Delta T2$ for the next turn off switching operation (e.g., operation 225).

Figure 3A:
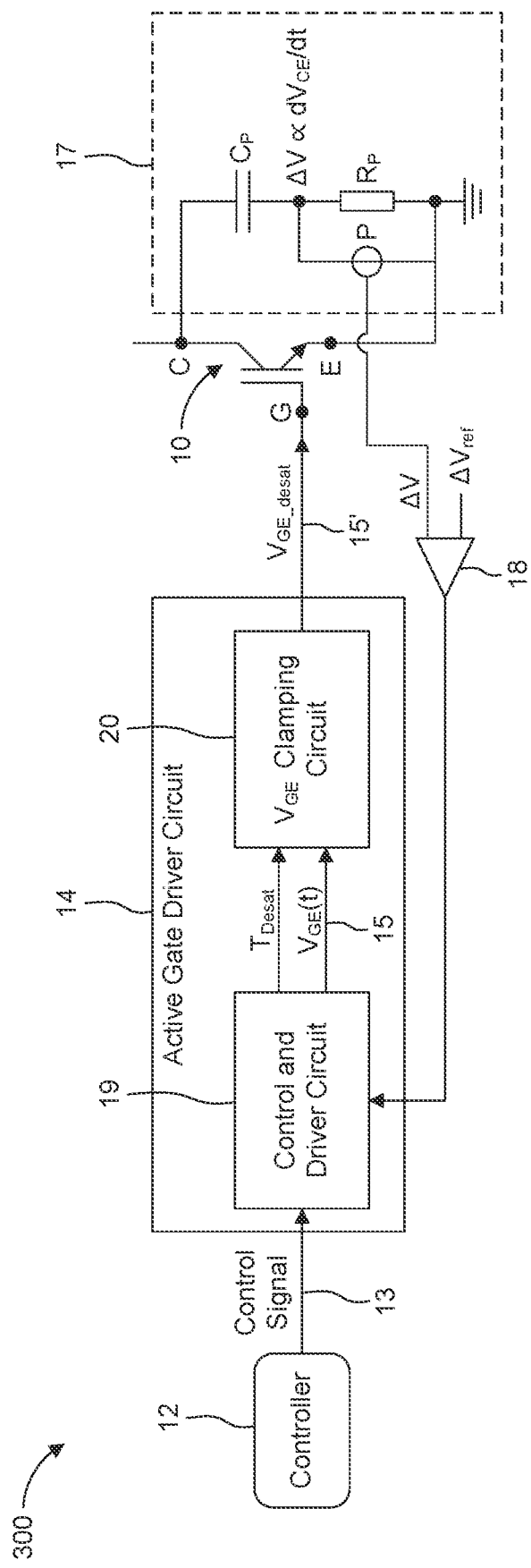
FIG. 3A is a schematic diagram of a gate driver system according to one or more embodiments.
Figure 3B:
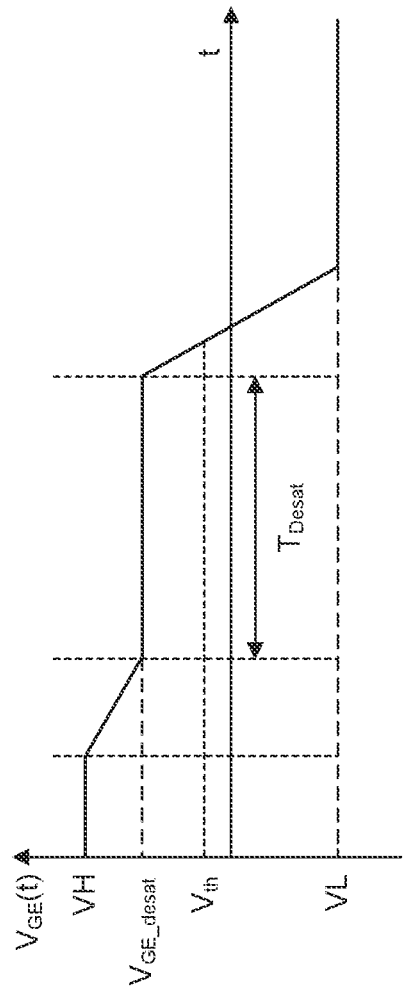
FIG. 3B is a waveform diagram of a gate control signal generated by a driver of the gate driver system during turn-off of a power transistor according to one or more embodiments.

FIG. 3A is a schematic diagram of a gate driver system 300 according to one or more embodiments. FIG. 3B is a waveform diagram of a gate control signal generated by a driver of the gate driver system 300 during turn-off of a power transistor according to one or more embodiments.

The gate driver system 300 includes a measurement circuit 17, a comparator 18, and a control and driver circuit 19 as components of the feedback circuit 16. The measurement circuit 17 includes a probe capacitor Cp and a series probe resistor Rp circuit that is coupled in parallel to the transistor 10. However, it will be appreciated that other measurement circuitry capable of measuring a parameter that is proportional to the voltage slew rate is also possible. For example, this may include a voltage divider, a resistive-capacitive voltage divider, or a circuit that measures a voltage drop across a stray inductance that is coupled in series with the transistor. The measurement circuitry could include more than one capacitor or resistor, and the capacitor and resistor could be connected in parallel instead of in series.

The comparator 18 measures a voltage drop $\Delta V$ across the probe resistor Rp during a current turn-off switching event of the transistor 10. A probe P may be used to tap this parameter from the circuit. The voltage drop $\Delta V$ represents a time derivative of a voltage across the transistor 10 during a turn-off switching event. In other words, the voltage drop $\Delta V$ is proportional to the voltage slew rate dv/dt of the transistor 10. The comparator 18 compares the measured voltage drop $\Delta V$ to a reference voltage $\Delta Vref$ that is proportional to a voltage slew rate limit and generated a comparison result (i.e., logic high or low) depending on the comparison result. For example, the comparator 18 may generate a logic high signal at its output when the measured voltage drop $\Delta V$ is greater than the reference voltage $\Delta Vref$ and generate a logic low signal at its output when the measured voltage drop $\Delta V$ is equal to or less than the reference voltage $\Delta Vref$. It will be appreciated that comparator circuitry other than a comparator 18 could be used to perform the comparison. For example, a processor could perform the comparison and generate the comparison result.

The control and driver circuit 19 evaluates the output of the comparator 18 (i.e., the comparison result) during a turn-off switching event of the transistor 10 in a similar manner described above in reference to operation 215 and determines a desaturation time Tdesat to be used for the next turn-off switching event of the transistor 10 based on the evaluated comparison result (e.g., according to operations 220 and 225).

The control and driver circuit 19 may perform its evaluation over a predetermined measurement interval during which the transistor 10 transitions from fully on to fully off. If at any point during the predetermined measurement interval the output of the comparator 18 indicates that the voltage slew rate has exceeded a threshold, then the desaturation time Tdesat is decreased for the next turn-off switching event. However, if the output of the comparator 18 indicates that the voltage slew rate has not exceeded the threshold at any point during the predetermined measurement interval, then the desaturation time Tdesat is increased for the next turn-off switching event. Accordingly, the control and driver circuit 19 regulates a duration of the desaturation time Tdesat based on the measured voltage drop $\Delta V$. The control and driver circuit 19 also generates a gate control signal VGE(t) (i.e., gate control signal 15) based on the control signal 13 received from controller 12.

Alternatively, the transistor parameter may be a function of the voltage slew rate measured over a predefined measurement interval. For example, the voltage drop ΔV used as the transistor parameter may be sampled over a predetermined measurement interval during which the transistor 10 transitions from fully on to fully off and the average of the transistor parameter over the predetermined measurement interval may be calculated. The average value of the transistor parameter may then be provided to the comparator 18 and compared to a reference voltage ΔVref that is proportional to an average voltage slew rate limit. One example of such an average voltage slew rate is a value proportional to the dv/dt_1090 value which is the average value of the dv/dt during the voltage rise rate between 10% and 90% of the applied DC-link voltage. Another example is the maximum average voltage rate appearing in a certain time interval with a pre-defined length. This can be determined, for example, by dividing the time interval of the voltage rise rate into n intervals (n≥2), determining the average voltage rise rate in each of these intervals, and selecting the maximum of these values as the transistor parameter.

The control and driver circuit 19 evaluates the output of the comparator 18 (i.e., the comparison result) during a turn-off switching event of the transistor 10 in a similar manner described above in reference to operation 215 and determines a desaturation time Tdesat to be used for the next turn-off switching event of the transistor 10 based on the evaluated comparison result (e.g., according to operations 220 and 225).

In this example, the active gate driver 14 includes the control and driver circuit 19 and a clamping circuit 20 that cooperatively regulate the gate control signal VGE(t) based on the measured voltage drop ΔV. The control and driver circuit 19 provides both the gate control signal VGE(t) and the desaturation time Tdesat to the clamping circuit 20. The desaturation time Tdesat is set to a duration determined from the previous turn-off switching event that immediately precedes the current turn-off switching event. During turn off of transistor 10, the control and driver circuit 19 transitions the gate control signal VGE(t) from a high voltage level VH to a low voltage level VL. The clamping circuit 20 clamps the gate control signal VGE(t) to a desaturation voltage level VGE_desat when the gate control signal VGE(t) reaches the desaturation voltage level VGE_desat and maintains the gate control signal VGE(t) at the desaturation voltage level VGE_desat for the set desaturation time Tdesat. Thus, the clamping circuit 20 detects when the gate control signal VGE(t) reaches desaturation voltage level VGE_desat for clamping.

By clamping the gate control signal VGE(t) to the desaturation voltage level VGE_desat for the set desaturation time Tdesat, desaturation is performed on the transistor for the optimum duration to sufficiently desaturate the transistor 10 according to its current operation point. The desaturation voltage level VGE_desat is set to a predetermined voltage programmed between the high voltage level VH and the low voltage level VL, and, more particularly, between the high voltage level VH and a turn-on/turn-off threshold voltage Vth of the transistor, where the turn-on/turn-off threshold voltage Vth is typically between 0 V and 5 V.

As a result, the clamping circuit 20 adapts the gate control signal VGE(t) (i.e., gate control signal 15) based on the desaturation time Tdesat determined from the previous turn-off switching event and outputs an adjusted gate control signal VGE(t) (i.e., adjusted gate control signal 15') to the gate terminal of transistor 10 in order to optimize the desaturation period of transistor 10 during turn off. Once the desaturation time Tdesat expires or lapses, the clamping circuit 20 unclamps the gate control signal VGE(t) and permits the gate control signal VGE(t) to transition from the desaturation voltage level VGE_desat to the low voltage level VL to fully turn off the transistor 10.

The measured voltage drop ΔV, used as the transistor parameter indicative of a voltage slew rate, is again evaluated during the next turn-off switching event to regulate the desaturation time Tdesat implemented for the next subsequent turn-off switching event, and so on. Thus, the desaturation time Tdesat may be adjusted for each subsequent turn-off switching event based on the evaluation performed in the turn-off switching event just prior thereto so that the desaturation time Tdesat can be dynamically regulated according to the real-time operation condition of transistor 10.

Figures 4A, 4B:
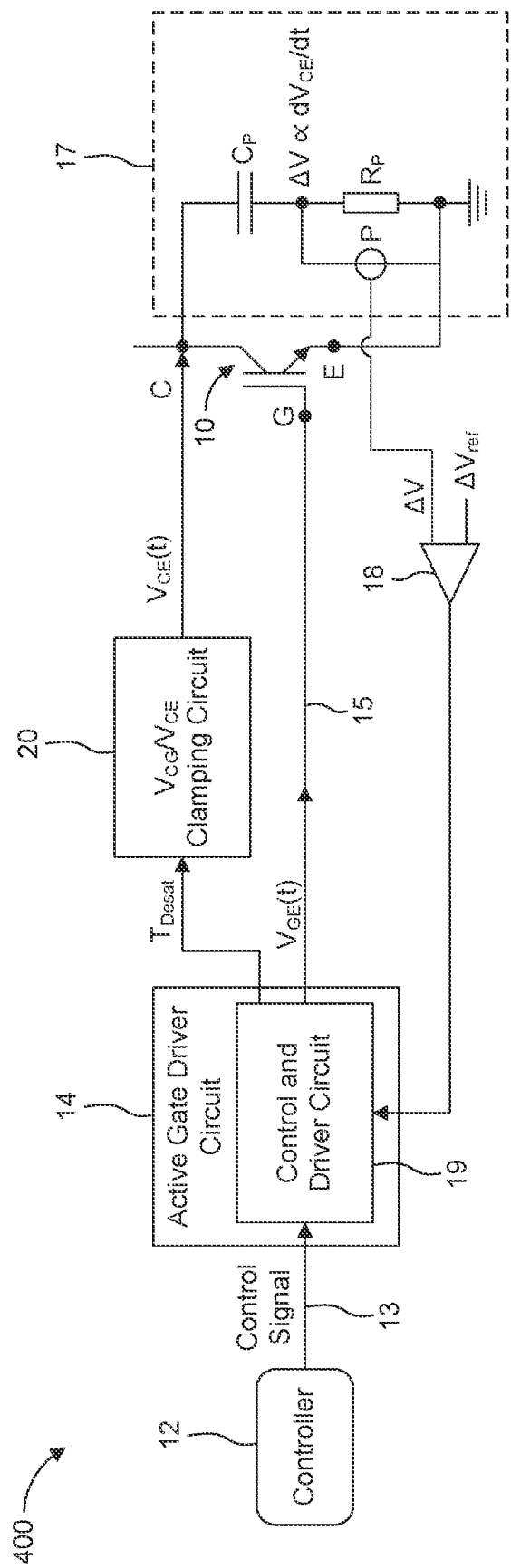
FIG. 4A is a schematic diagram of a gate driver system according to one or more embodiments.
FIG. 4B is a waveform diagram of a gate control signal generated by a driver of the gate driver system during turn-off of a power transistor according to one or more embodiments.

FIG. 4A is a schematic diagram of a gate driver system 400 according to one or more embodiments. FIG. 4B is a waveform diagram of a gate control signal generated by a driver of the gate driver system 400 during turn-off of a power transistor according to one or more embodiments. The gate driver system 400 is similar to gate driver system 300, with the exception that the clamping circuit 20 is coupled to the collector transistor 10 instead of the gate. The control and driver circuit 19 generates the gate control signal VGE(t) (i.e., gate control signal 15) based on the control signal 13 received from controller 12 and provides the gate control signal VGE(t) to the gate terminal of transistor 10. The control and driver circuit 19 also provides the desaturation time Tdesat determined from the previous turn-off switching event that immediately precedes the current turn-off switching event to the clamping circuit 20. Accordingly, the control and driver circuit 19 is still responsible for dynamically configuring the desaturation time Tdesat at the clamping circuit 20 based on method 200.

The clamping circuit 20 clamps the collector-emitter voltage VCE(t) or the collector-gate voltage VCG(t) to a desaturation voltage level VCE_desat when the collector-emitter voltage VCE(t) or the collector-gate voltage VCG(t) reaches the desaturation voltage level VCE_desat and maintains the collector-emitter voltage VCE(t) or the collector-gate voltage VCG(t) at the desaturation voltage level VCE_desat for the set desaturation time Tdesat. In particular, when the gate control signal VGE(t) is transitioned from the high voltage level VH and the low voltage level VL, the transistor turns off, which causes the collector voltage to rise from a low collector voltage VCE(on). The clamping circuit 20 detects when the collector voltage, specifically the collector-emitter voltage VCE(t), reaches desaturation voltage level VCE_desat for clamping. Upon reaching the desaturation voltage level VCE_desat, the clamping circuit clamps VCE(t) to the desaturation voltage level VCE_desat and maintains it at the desaturation voltage level VCE_desat for the set desaturation time Tdesat. Once the desaturation time Tdesat expires or lapses, the clamping circuit 20 unclamps VCE(t) and permits VCE(t) to transition from the desaturation voltage level VCE_desat to an upper limit (e.g., to the value of the positive supply rail).

By clamping the collector voltage during turn off, and specifically the collector-emitter voltage VCE(t), to the desaturation voltage level VCE_desat for the set desaturation time Tdesat, desaturation is performed on the transistor for the optimum duration to sufficiently desaturate the transistor 10 according to its current operation point.

Figure 5A:
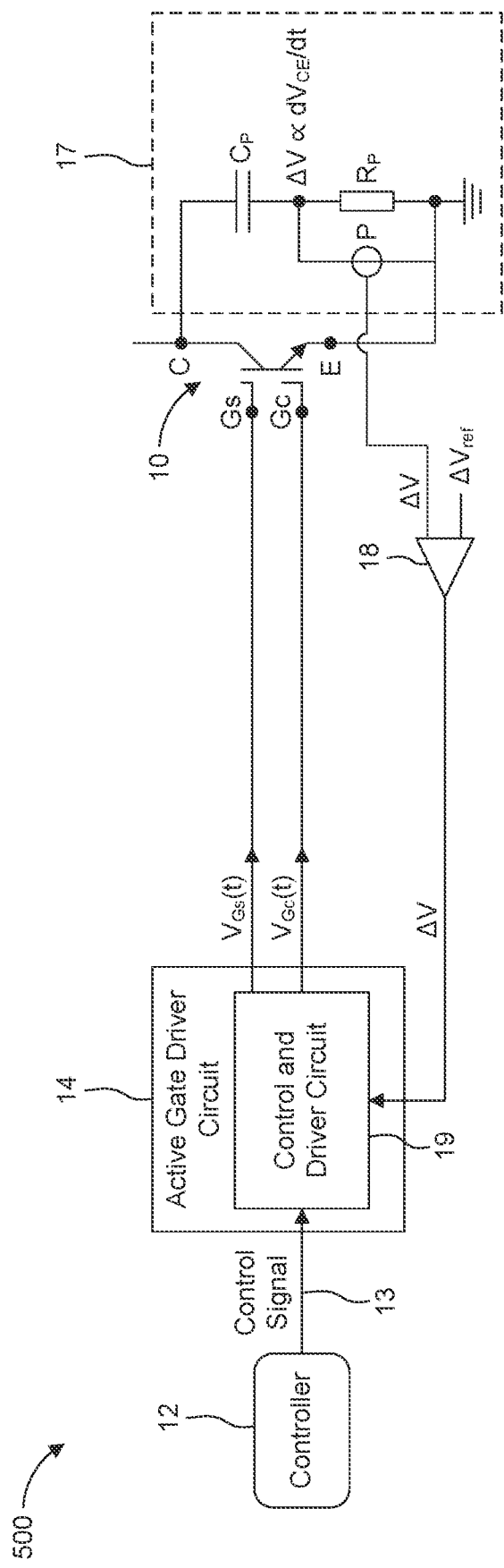
FIG. 5A is a schematic diagram of a gate driver system according to one or more embodiments.
Figure 5B:
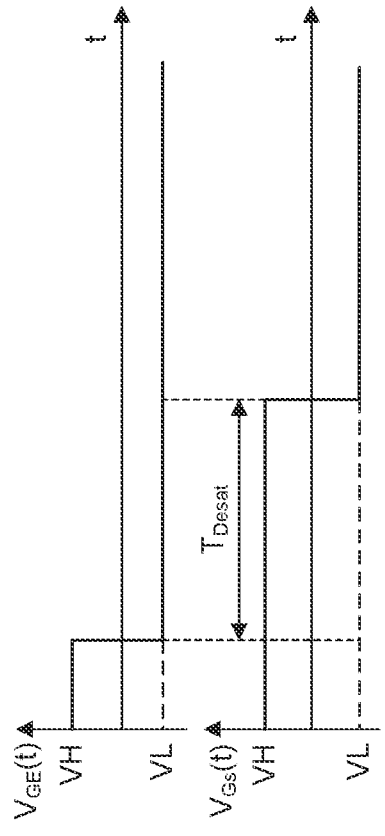
FIG. 5B is a waveform diagram of gate control signals generated by a driver of the gate driver system during turn-off of a power transistor according to one or more embodiments.

FIG. 5A is a schematic diagram of a gate driver system 400 according to one or more embodiments. FIG. 5B is a waveform diagram of gate control signals generated by a driver of the gate driver system 500 during turn-off of a power transistor according to one or more embodiments. The gate driver system 500 is similar to gate driver system 300, with the exception that the transistor 10 is a dual gate transistor whose switching states are controlled by two gate control signals, including a switching gate control signal VGs(t) and control gate control signal VGc(t). In this example, a clamping circuit is not provided.

A dual gate transistor includes two FET regions, each of which includes its own gate terminal. The two gate terminals are referred to as a control gate Gc controlled by the control gate control signal VGc(t) and a switching gate Gs controlled by the switching gate control signal VGs(t). Both gate control signals are toggled between two respective voltage levels but in a staggered or delayed manner. To turn-on the whole transistor area, both gate signals are typically set to the same high voltage level VH. In this case, both gate control signals are toggled between the same high voltage level VH and the same low voltage level VL. However, it will be appreciated that one or both voltage levels of one gate control signal may be different from the voltage levels of the other gate control signal.

During turn off of the transistor 10, the control and driver circuit 19 first toggles the control gate control signal VGc(t) from VH to VL and then, after a desaturation time Tdesat, toggles the switching gate control signal VGs(t) from VH to VL. Desaturation is performed on the transistor during the time the control gate control signal VGc(t) is low and the switching gate control signal VGs(t) is high. The desaturation is performed for the optimum duration to sufficiently desaturate the transistor 10 according to its current operation point based on the desaturation time Tdesat determined from the previous turn-off switching event that immediately precedes the current turn-off switching event.

The control and driver circuit 19 generates the switching gate control signal VGs(t) and the control gate control signal VGc(t) based on the control signal 13 from controller 12 and adjusts a timing between falling edge transitions of the two gate control signals to coincide with the set desaturation time Tdesat determined for that turn-off switching event. The control and driver circuit 19 is configured to trigger a transition of a gate voltage of the control gate from a VH to VL during each turn-off switching event at a first trigger time and trigger a transition of a gate voltage of the switching gate from VH to VL during each turn-off switching event at a second trigger time that is offset subsequent to the first trigger time by the duration of the desaturation time.

Figure 6A:
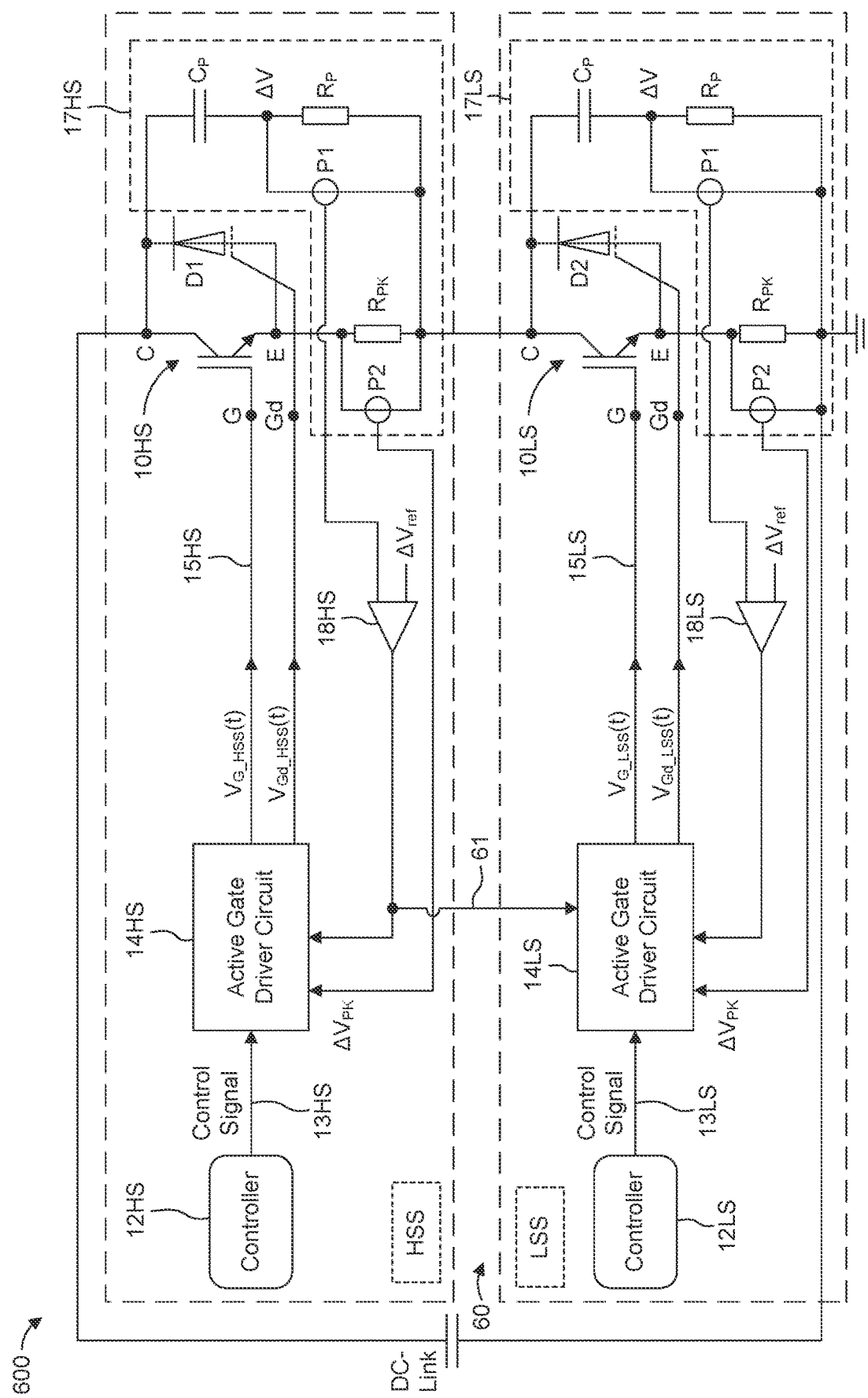
FIG. 6A is a schematic diagram of a gate driver system according to one or more embodiments.
Figure 6B:
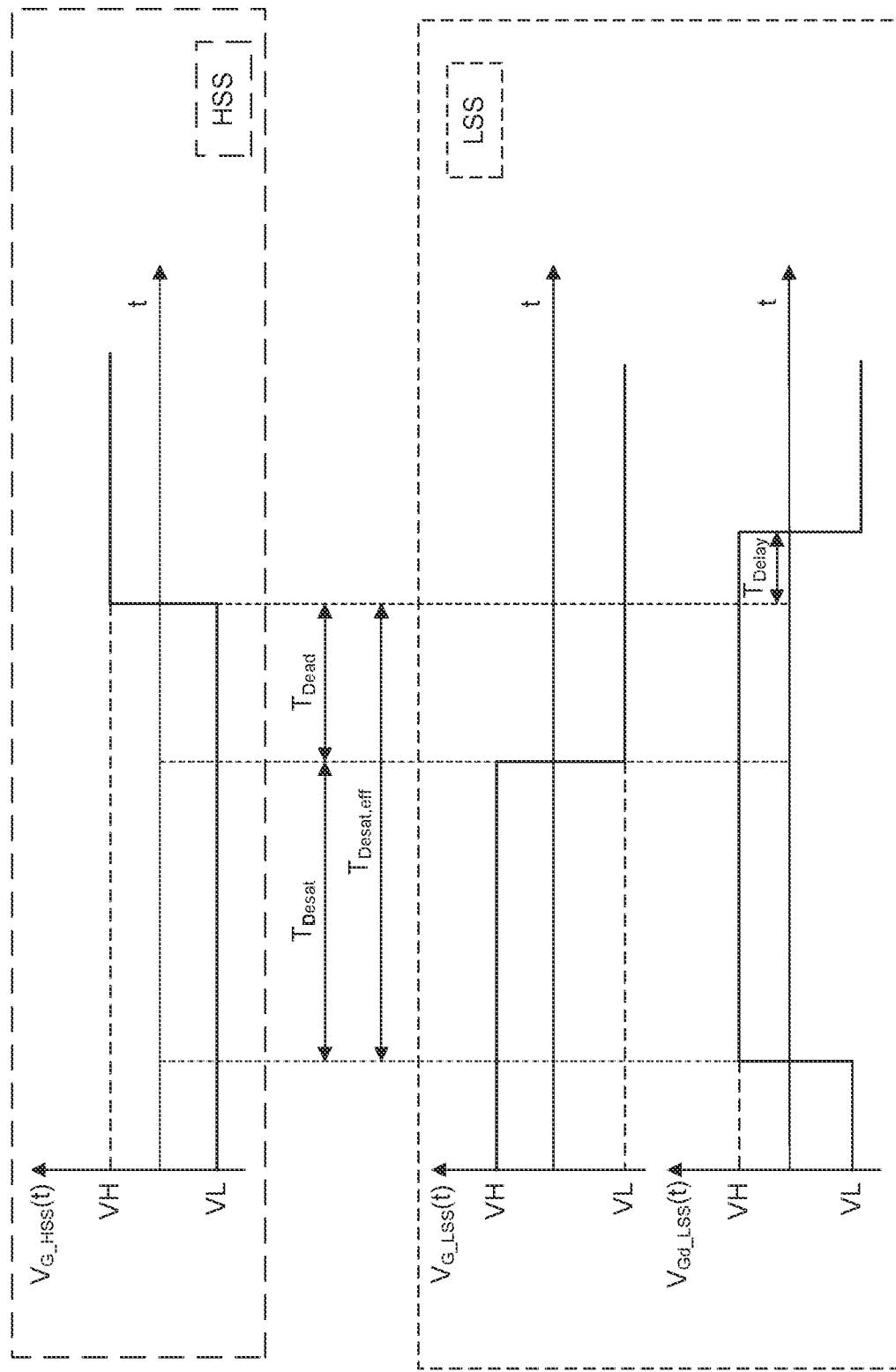
FIG. 6B is a waveform diagram of gate control signals generated by a driver of the gate driver system during turn-off of a power transistor according to one or more embodiments.

FIG. 6A is a schematic diagram of the gate driver system for a transistor half-bridge according to one or more embodiments. FIG. 6B is a waveform diagram of gate control signals generated by a driver of the gate driver system 600 during turn-off of a power transistor according to one or more embodiments. In particular, FIG. 6B illustrates switching events during which a high-side transistor 10HS is turned on (i.e., a turn-on switching event for the high-side transistor 10HS), a low-side transistor 10LS is turned off (i.e., a turn-off switching event for the low-side transistor 10LS, and a low-side gate-controlled freewheeling diode D2 is toggled on and then off). The toggling of the low-side gate-controlled freewheeling diode D2 on and then off may be considered part of the turn-off switching event for the low-side transistor 10LS. Similar switching events occur when the high-side transistor 10HS is turned off and the low-side transistor 10LS is turned on, with the high-side gate-controlled freewheeling diode D1 being toggled on and then off in a similar manner shown for diode D2. The toggling of the high-side freewheeling diode D1 on and then off may be considered part of the turn-off switching event for the high-side transistor 10HS.

The half bridge includes a low-side power transistor 10LS and a high-side power transistor 10HS. The gate driver system 600 includes gate drivers for each power transistor. Specifically, the gate driver system 600 includes a low-side gate driver circuit 14LS that drives the low-side power transistor 10LS and a high-side gate driver circuit 14HS that drives the high-side power transistor 10HS. Additionally, the gate driver system 600 includes measurement circuits 17HS and 17LS and comparators 18HS and 18LS that perform similar operations described above for measuring a transistor parameter (e.g., ΔV) indicative of a voltage slew rate of its respective transistor and providing a comparison result to a respective gate driver circuit. Here, probes P1 of the measurement circuits 17HS and 17LS measure respective voltage drops ΔV across respective probe resistors Rp.

Accordingly, the gate driver circuits 14HS and 14LS and their associated circuitry are provided in duplicate, having similar components. Referring to FIG. 6A in view of FIGS. 3A, 4A, and/or 5A, equivalent or like elements or elements with equivalent or like functionality are denoted with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

The gate driver circuits 14HS and 14LS operate in different voltage domains HSS and LSS. Thus, they are separated by an isolation region 60, also referred to as a termination region. The gate driver circuits 14HS and 14LS may be integrated on a single die or may be on separate dies. The gate driver circuits 14HS and 14LS may each include a corresponding transceiver (not illustrated) for transmitting and receiving signals across the isolation region 60. For example, an output of comparator 18HS may be communicatively coupled across the isolation region 60 to provide its comparison result to the gate driver circuit 14LS. One or more level shifters 61 may be provided in the isolation region 60 for transmitting the comparison result. The level shifter 61 is configured to convert signals from one voltage level corresponding to one voltage domain to another voltage level corresponding to the other voltage domain. Similarly, while not illustrated, an output of comparator 18LS may be communicatively coupled across the isolation region 60 in a similar manner to provide its comparison result to the gate driver circuit 14HS.

It is also noted that while two controllers 12HS and 12LS are shown, it is also conceivable that only a single controller is provided. In such a case, the single controller may reside in voltage domain LSS and may transmit control signals to the gate driver circuit 14HS through the isolation region 60 via transceivers located at opposite sides of the isolation region 60.

As noted above, FIG. 6B illustrates switching events during which the high-side transistor 10HS is turned on (i.e., a turn-on switching event for the high-side transistor 10HS), the low-side transistor 10LS is turned off (i.e., a turn-off switching event for the low-side transistor 10LS, and the low-side freewheeling diode D2 is toggled on and then off.

In the low-side voltage domain LSS, a gate-controlled freewheeling diode D2 is coupled antiparallel to low-side transistor 10LS. For example, the gate-controlled freewheeling diode D2 and the low-side transistor 10LS may be implemented in separate semiconductor bodies or be implemented in a same semiconductor body. Like low-side transistor 10LS, the gate-controlled freewheeling diode D2 includes a gate terminal Gd whose voltage is regulated by the gate driver circuit 14LS for controlling a conduction state of the device. The gate-controlled freewheeling diode D2 is turned on during a turn-off switching event of low-side transistor 10LS to provide an alternative current path for the load current in order to prevent high voltage peaks and losses. This means that the gate-controlled freewheeling diode D2 is turned on during a turn-on switching event of high-side transistor 10HS. Because diode D2 is gate-controlled, electron hole plasma collects in the active region of the diode that should be reduced via desaturation to reduce losses during turn on of the high-side transistor 10HS.

The low-side gate driver circuit 14LS is coupled to both the gate terminal G of low-side transistor 10LS and to the gate terminal Gd of diode D2 to provide respective gate control signals. The low-side gate driver circuit 14LS generates a gate control signal $V_{G\_LSS}(t)$ (i.e., gate control signal 15LS) based on control signal 13LS to control the gate voltage at the gate terminal G of low-side transistor 10LS in order to drive the transistor between the switching states. Similarly, the low-side gate driver circuit 14LS generates a gate control signal $V_{Gd\_LSS}(t)$ to control the gate voltage at the gate terminal Gd of diode D2 in order to drive the diode D2 between the on/off conduction states.

The gate driver circuit 14LS triggers a falling transition of the gate voltage $V_{G\_LSS}(t)$ from the high voltage level VH to the low voltage level VL at a first trigger time during each turn-off switching event of the low-side transistor 10LS. The gate driver circuit 14LS determines the first trigger time based on the control signal 13LS.

It is also noted that a dead time Tdead is implemented by the gate driver circuits 14HS and 14LS where both transistors 10HS and 10LS are turned off to ensure they do not simultaneously conduct current. Thus, the turn on time can be calculated from the turn off time of the complementary transistor. In this case, the turn on time of the high-side transistor is delayed or offset from the turn off time of the low-side transistor by the dead time Tdead.

The low-side gate driver circuit 14LS also triggers a rising transition of the gate voltage $V_{Gd\_LSS}(t)$ of the diode D2 from the low voltage level VL to the high voltage level VH at a second trigger time during each of the turn-off switching events of the low-side transistor 10LS. The gate driver circuit 14LS may determine the second trigger time based on the first trigger time and a set desaturation time Tdesat. In particular, the second trigger time is offset prior to or ahead of the first trigger time by the desaturation time Tdesat that was determined from the previous turn-off switching event of the low-side transistor 10LS that immediately precedes the current turn-off switching event.

The low-side measurement circuit 17LS measures a transistor parameter (e.g., $\Delta V$) indicative of a voltage slew rate of the low-side transistor 10LS for a current turn-off switching event during which the low-side transistor 10LS is transitioned from an on state to an off state and the low-side comparator 18LS provides a comparison result to the low-side gate driver circuit 14LS for regulating duration of the desaturation time to be used for the next turn-off switching event during which the low-side transistor 10LS, according to method 200. In this way, the period between the first trigger time and the second trigger time is adjusted for the next turn-off switching event.

The regulation of the duration of the desaturation time Tdesat may depend on a current direction measurement of the load current. In the case that the load current is flowing through the low-side diode D2 before the turn off of the low-side transistor 10LS, then the transistor parameter is indicative or proportional to the amount of plasma in the diode D2 and can be used to set the desaturation time Tdesat to the optimum duration to be used for desaturating the diode D2 on the next turn-off switching event. In this case, the control of the desaturation time Tdesat would change the charge carrier density inside the low-side diode D2 and have an impact on the turn-on of the high-side transistor 10HS. In this case, when the load current is flowing through the low-side diode D2 at the time the transistor parameter is measured, the low-side diode D2 is actually determining (i.e., affecting) the voltage slew rate dv/dt of the upcoming turn-on of the high-side transistor 10HS. On the other hand, in the case that the load current is flowing through the low-side transistor 10LS before it is turned off, then the control of the desaturation time Tdesat in the gate voltage $V_{Gd\_LSS}(t)$ of low-side diode D2 would have no impact on the switching speed of the high-side transistor 10HS. In this case, when the load current is flowing through the low-side transistor 10LS at the time the transistor parameter is measured, the low-side transistor 10LS is determining the voltage slew rate dv/dt of its upcoming turn-off.

Accordingly, the measurement circuit 17LS may include a current direction measurement circuit that includes a voltage probe P2 and a resistor Rpk connected in series with the low-side transistor 10LS and through which the load current flows. The voltage probe P2 measures a voltage drop $\Delta Vpk$ across the resistor Rpk. If the voltage drop $\Delta Vpk$ is less than 0V, load current is flowing through the low-side diode D2 and the desaturation time Tdesat of the MOS-gated diode D2 is to be controlled based on transistor parameter $\Delta V$. The measurement of the transistor parameter $\Delta V$ or the sampling of the comparison result can be performed or triggered by the gate driver circuit 14HS when the voltage drop $\Delta Vpk$ is less than 0V during the turn-off switching event of the low-side transistor 10LS. If the voltage drop $\Delta Vpk$ is greater than 0V, load current is flowing through the low-side transistor 10LS and of the desaturation time Tdesat of the MOS-gated diode D2 should not be controlled based on the $\Delta V$.

Thus, the measurement circuit 17LS is configured to measure the transistor parameter $\Delta V$ or sample the comparison result of comparator 18LS for a turn-off switching event of the low-side transistor 10LS while the load current is flowing through diode D2. The measurement circuit 17LS includes a current direction measurement configured to detect a current direction of the load current and determine when the load current is flowing through the diode D2 based on the detected current direction.

As noted above, the period between the first trigger time and the second trigger time is the desaturation time Tdesat determined by the gate driver circuit 14LS from the measurements taken during the previous turn-off switching event of the low-side transistor 10LS. During the desaturation time, charge carrier concentrations of electrons and holes within the gate-controlled freewheeling diode D2 are reduced. As a result, losses for turning on the high-side transistor 10HS are reduced. The desaturation is performed for the optimum duration to sufficiently desaturate the gate-controlled freewheeling diode D2 according to the current operation point of the low-side transistor 10LS determined from the previous turn-off switching event that precedes the current turn-off switching event.

The dead time Tdead immediately follows the desaturation time Tdesat, and the summation of the desaturation time Tdesat and the dead time Tdead can be referred to as the effective desaturation time Tdesat,eff. The gate-controlled freewheeling diode D2 is turned off after a delay time Tdelay once the high-side transistor 10HS is fully turned on. This delay time Tdelay may be preconfigured at the gate driver circuit 14HS and is set to a duration that ensures full turn on of the high-side transistor 10HS.

Turning to the high-side voltage domain HSS, a gate-controlled freewheeling diode D1 is coupled antiparallel to high-side transistor 10HS. For example, the gate-controlled freewheeling diode D1 and the high-side transistor 10HS may be implemented in separate semiconductor bodies or be implemented in a same semiconductor body. Like high-side transistor 10HS, the gate-controlled freewheeling diode D1 includes a gate terminal whose voltage is regulated by the gate driver circuit 14HS for controlling a conduction state of the device. The gate-controlled freewheeling diode D1 is turned on during a turn-off switching event of high-side transistor 10HS to provide an alternative current path for the load current in order to prevent high voltage peaks and losses. This means that the gate-controlled freewheeling diode D1 is turned on during a turn-on switching event of low-side transistor 10LS. Because diode D1 is gate-controlled, electron hole plasma collects in the active region of the diode that should be reduced via desaturation to reduce losses during turn on of the low-side transistor 10LS.

The high-side gate driver circuit 14HS is coupled to both the gate terminal G of high-side transistor 10HS and to the gate terminal Gd of diode D1 to provide respective gate control signals. The high-side gate driver circuit 14HS generates a gate control signal $V_{G\_HSS}(t)$ (i.e., gate control signal 15HS) based on control signal 13HS to control the gate voltage at the gate terminal G of high-side transistor 10HS in order to drive the transistor between the switching states. Similarly, the high-side gate driver circuit 14HS generates a gate control signal $V_{Gd\_HSS}(t)$ to control the gate voltage at the gate terminal Gd of diode D1 in order to drive the diode D1 between the on/off conduction states.

The gate driver circuit 14HS triggers a falling transition of the gate voltage $V_{G\_HSS}(t)$ from the high voltage level VH to the low voltage level VL at a first trigger time during each turn-off switching event of the high-side transistor 10HS. The gate driver circuit 14HS determines the first trigger time based on the control signal 13HS.

It is also noted that a predefined dead time Tdead is implemented by the gate driver circuits 14HS and 14LS where both transistors 10HS and 10LS are turned off to ensure they do not simultaneously conduct current. Thus, the turn on time of a transistor can be calculated from the turn off time of its complementary transistor using the predefined dead time Tdead. In this case, the turn on time of the low-side transistor is delayed or offset from the turn off time of the high-side transistor by the dead time Tdead.

The high-side gate driver circuit 14HS also triggers a rising transition of the gate voltage $V_{Gd\_HSS}(t)$ of the diode D1 from the low voltage level VL to the high voltage level VH at a second trigger time during each of the turn-off switching events of the high-side transistor 10HS. The gate driver circuit 14HS may determine the second trigger time based on the first trigger time and a set desaturation time Tdesat. In particular, the second trigger time is offset prior to or ahead of the first trigger time by the desaturation time Tdesat that was determined from the previous turn-off switching event of the high-side transistor 10HS that immediately precedes the current turn-off switching event.

The high-side measurement circuit 17HS measures a transistor parameter (e.g., ΔV) indicative of a voltage slew rate of the high-side transistor 10HS for a current turn-off switching event during which the high-side transistor 10HS is transitioned from an on state to an off state and the high-side comparator 18HS provides a comparison result to the high-side gate driver circuit 14HS for regulating duration of the desaturation time to be used for the next turn-off switching event during which the high-side transistor 10HS, according to method 200. In this way, the period between the first trigger time and the second trigger time is adjusted for the next turn-off switching event.

The regulation of the duration of the desaturation time Tdesat may depend on a current direction measurement of the load current. In the case that the load current is flowing through the high-side diode D1 before the turn off of the high-side transistor 10HS, then the transistor parameter is indicative or proportional to the amount of plasma in the diode D1 and can be used to set the desaturation time Tdesat to the optimum duration to be used for desaturating the diode D1 on the next turn-off switching event. In this case, the control of the desaturation time Tdesat would change the charge carrier density inside the high-side diode D1 and have an impact on the turn-on of the low-side transistor 10LS. In this case, when the load current is flowing through the high-side diode D1 at the time the transistor parameter is measured, the high-side diode D1 is actually determining (i.e., affecting) the voltage slew rate dv/dt. On the other hand, in the case that the load current is flowing through the high-side transistor 10HS before it is turned off, then the control of the desaturation time Tdesat in the gate voltage $V_{Gd\_HSS}(t)$ of the high-side diode D1 would have no impact on the switching speed of the low-side transistor 10LS. In this case, when the load current is flowing through the high-side transistor 10HS at the time the transistor parameter is measured, the high-side transistor 10HS is determining the voltage slew rate dv/dt of its upcoming turn-off.

Accordingly, the measurement circuit 17HS may include a current direction measurement circuit that includes a voltage probe P2 and a resistor Rpk connected in series with the high-side transistor 10HS and through which the load current flows. The voltage probe P2 measures a voltage drop ΔVpk across the resistor Rpk. If the voltage drop ΔVpk is less than 0V, load current is flowing through the high-side diode D1 and the desaturation time Tdesat the MOS-gated diode D1 is to be controlled based on transistor parameter ΔV. The measurement of the transistor parameter ΔV or the sampling of the comparison result can be performed or triggered by the gate driver circuit 14HS when the voltage drop ΔVpk is less than 0V during the turn-off switching event of the high-side transistor 10HS. If the voltage drop ΔVpk is greater than 0V, load current is flowing through the high-side transistor 10HS and of the desaturation time Tdesat of the MOS-gated diode D1 should not be controlled based on transistor parameter ΔV.

Thus, the measurement circuit 17HS is configured to measure the transistor parameter ΔV or sample the comparison result of comparator 18HS for a turn-off switching event of the high-side transistor 10HS while the load current is flowing through diode D1. The measurement circuit 17HS includes a current direction measurement configured to detect a current direction of the load current and determine when the load current is flowing through the diode D1 based on the detected current direction.

As noted above, the period between the first trigger time and the second trigger time is the desaturation time Tdesat determined by the gate driver circuit 14HS from the measurements taken during the previous turn-off switching event of the high-side transistor 10HS. During the desaturation time Tdesat, charge carrier concentrations of electrons and holes within the gate-controlled freewheeling diode D1 are reduced. As a result, losses for turning on the low-side transistor 10LS are reduced. The desaturation is performed for the optimum duration to sufficiently desaturate the gate-controlled freewheeling diode D1 according to the current operation point of the high-side transistor 10HS determined from the previous turn-off switching event that precedes the current turn-off switching event.

The dead time Tdead immediately follows the desaturation time Tdesat, and the summation of the desaturation time Tdesat and the dead time Tdead can be referred to as the effective desaturation time Tdesat,eff. The gate-controlled high-side freewheeling diode D1 is turned off after a delay time Tdelay once the low-side transistor 10LS is fully turned on. This delay time Tdelay may be preconfigured at the gate driver circuit 14HS and is set to a duration that ensures full turn on of the low-side transistor 10LS.

In an alternative control scheme for the gate-controlled freewheeling diodes, it is possible to determine the desaturation time Tdesat for a gate-controlled freewheeling diode located in one voltage domain by measuring the transistor parameter (e.g., voltage slew rate or ΔV) of the transistor located in the other voltage domain during its turn-on switching event. This is because the transistor parameter (e.g., voltage slew rate or ΔV) of the complementary transistor pairs are related to each other. Thus, the voltage slew rate of the high-side transistor during its turn on is related to the voltage slew rate of the low-side transistor during its turn off in the same PWM cycle (i.e., in the same turn-off/turn-on procedure of the two complementary transistors). Each PWM cycle includes turning off a first transistor, turning on the complementary, second transistor, and toggling the freewheeling diode coupled to the first transistor on prior to the turn-off of the first transistor, and toggling the freewheeling diode coupled to the first transistor off after the turn-on of the second transistor, for example, as shown in FIG. 6B.

Under this control scheme, and using the turn-off of the low-side transistor 10LS as an example, the high-side comparator 18HS is used to measure and compare the voltage drop ΔV at the high-side transistor 10HS during its turn-on switching event. The high-side comparator 18HS provides its comparison result via the level-shifter 61 to the low-side gate driver circuit 14LS. The low-side gate driver circuit 14LS determines whether the voltage slew rate of the high-side transistor 10HS exceeded a threshold value based on the comparison result, and adjusts the desaturation time Tdesat according to operations 220 and 225 to be applied to the gate-controlled freewheeling diode D2 for the next turn-off switching event of low-side transistor 10LS. Thus, the measurement at the high-side comparator 18HS is used to regulate the duration of the desaturation time Tdesat applied at the low-side voltage domain during the next PWM cycle.

The sampling of the transistor parameter or of the comparison result may also be determined via the current direction measurement circuit in a similar manner described above.

In summary of this alternative control scheme, a half bridge circuit includes a first transistor and a second transistor, wherein the first transistor is configured to be turned on and the second transistor is configured to be turned off during each of a plurality of switching event. A gate-controlled freewheeling diode is coupled antiparallel to the second transistor, wherein the gate-controlled freewheeling diode is configured to be turned on during each of the plurality of switching events. A gate driver circuit coupled to a first gate terminal of the second transistor and to a second gate terminal of the gate-controlled freewheeling diode. The gate driver circuit controls a first gate voltage at the first gate terminal in order to drive the second transistor between the switching states, wherein the gate driver circuit is configured to trigger a first transition of the first gate voltage from a first voltage level to a second voltage level during each of the plurality of switching events at a first trigger time, wherein the second voltage level is less than the first voltage level. The gate driver circuit also controls a second gate voltage at the second gate terminal in order to drive the gate-controlled freewheeling diode between conduction states, wherein the gate driver circuit is configured to trigger a second transition of the second gate voltage from a third voltage level to a fourth voltage level during each of the plurality of switching events at a second trigger time, wherein the fourth voltage level is greater than the third voltage level, and wherein the second trigger time is offset prior to the first trigger time by a desaturation time. A measurement circuit measures a transistor parameter indicative of a voltage slew rate of the first transistor for a first switching event during which the first transistor is transitioned from an off state to an on state. A control circuit receives the measured transistor parameter and regulates a duration of the desaturation time based on the measured transistor parameter. The control circuit compares the measured transistor parameter to a threshold value to generate a comparison result and regulates the duration of the desaturation time for a next turn-off switching event of the transistor based on the comparison result. The control circuit may adjust the second trigger time based on the comparison result and the determined desaturation time.

Additional embodiments are provided below.

1. A gate driver system, comprising:
    a transistor configured to be driven between switching states;
    a gate driver circuit coupled to a gate terminal of the transistor and configured to control a gate voltage at the gate terminal in order to drive the transistor between the switching states, wherein the gate driver circuit is configured to generate a gate control signal that controls the gate voltage during each of a plurality of turn-off switching events to turn off the transistor, wherein the transistor is configured to be turned off according to a desaturation time during each of the plurality of turn-off switching events;
    a measurement circuit configured to measure a transistor parameter indicative of a voltage slew rate of the transistor for a first turn-off switching event during which the transistor is transitioned from an on state to an off state; and
    a control circuit configured to receive the measured transistor parameter and regulate a duration of the desaturation time based on the measured transistor parameter.

2. The gate driver system of embodiment 1, wherein the transistor comprises a first load terminal and a second load terminal, and the voltage slew rate corresponds to a voltage across the first load terminal and the second load terminal.

3. The gate driver system of any of embodiments 1 and 2, wherein the transistor parameter is proportional to the voltage slew rate.

4. The gate driver system of any of embodiments 1-3, wherein the transistor parameter is a function of the voltage slew rate measured over a predefined measurement interval.

5. The gate driver system of any of embodiments 1-4, wherein the transistor parameter corresponds to an operation point of the transistor that changes based on at least one operating condition of the transistor.

6. The gate driver system of any of embodiments 1-5, wherein, during the desaturation time, charge carrier concentrations of electrons and holes within the transistor are reduced.

7. The gate driver system of any of embodiments 1-6, wherein the control circuit is configured to compare the measured transistor parameter to a threshold value to generate a comparison result and regulate the duration of the desaturation time for a next turn-off switching event of the transistor based on the comparison result.

8. The gate driver system of any of embodiments 1-7, wherein:
on a first condition that the measured transistor parameter exceeds the threshold value, the control circuit is configured to decrease the duration of the desaturation time for the next turn-off switching event, and
on a second condition that the measured transistor parameter does not exceed the threshold value, the control circuit is configured to increase the duration of the desaturation time for the next turn-off switching event.

9. The gate driver system of any of embodiments 1-8, wherein:
on the first condition that the measured transistor parameter exceeds the threshold value, the control circuit is configured to decrease the duration of the desaturation time for the next turn-off switching event by a first predetermined amount, and
on the second condition that the measured transistor parameter does not exceed the threshold value, the control circuit is configured to increase the duration of the desaturation time for the next turn-off switching event by a second predetermined amount.

10. The gate driver system of any of embodiments 1-9, wherein the comparison result indicates whether or not the measured transistor parameter exceeds the threshold value at any point during the first turn-off switching event.

11. The gate driver system of any of embodiments 1-10, wherein:
the gate driver circuit is configured to transition the gate voltage from a first voltage level to a second voltage level during each of the plurality of turn-off switching events,
wherein the gate driver circuit further comprises a clamping circuit coupled to the gate terminal, wherein the clamping circuit is configured to clamp the gate voltage to a desaturation voltage level for the duration of the desaturation time, wherein the desaturation voltage level is between the first voltage level and the second voltage level.

12. The gate driver system of any of embodiments 1-11, wherein the desaturation voltage level is between the first voltage level and a turn-on/turn-off threshold voltage of the transistor.

13. The gate driver system of any of embodiments 1-12, wherein during the transition the gate voltage from the first voltage level to the second voltage level during each of the plurality of turn-off switching events, the clamping circuit is configured to clamp the gate voltage to the desaturation voltage level for the duration of the desaturation time when the gate voltage reaches the desaturation voltage level from the first voltage level.

14. The gate driver system of any of embodiments 1-13, wherein the clamping circuit is configured to permit the gate voltage to transition from the desaturation voltage level to the second voltage level upon expiration of the desaturation time.

15. The gate driver system of any of embodiments 1-14, wherein:
the gate driver circuit is configured to transition the gate voltage from a first voltage level to a second voltage level during each of the plurality of turn-off switching events,
the transistor comprises a first load terminal and a second load terminal, a load current configured to flow from the first load terminal to the second load terminal, and
the gate driver system further comprises:
a clamping circuit coupled to the first load terminal, wherein the clamping circuit is configured to clamp a terminal voltage of the first load terminal to a desaturation voltage level for the duration of the desaturation time.

16. The gate driver system of any of embodiments 1-15, wherein:
the transistor is a dual gate transistor comprising a control gate and the gate terminal as a switching gate,
the gate driver circuit is configured to trigger a transition of a gate voltage of the control gate from a first voltage level to a second voltage level during each of the plurality of turn-off switching events at a first trigger time, and
the gate driver circuit is configured to trigger a transition of a gate voltage of the switching gate from a third voltage level to a fourth voltage level during each of the plurality of turn-off switching events at a second trigger time that is offset subsequent to the first trigger time by the duration of the desaturation time.

17. A gate driver system, comprising:
a transistor configured to be driven between switching states wherein the transistor is configured to be turned off during each of a plurality of switching events;
a gate-controlled freewheeling diode coupled antiparallel to the transistor, wherein the gate-controlled freewheeling diode is configured to be turned on during each of the plurality of switching events;
a gate driver circuit coupled to a first gate terminal of the transistor and to a second gate terminal of the gate-controlled freewheeling diode,
wherein the gate driver circuit is configured to control a first gate voltage at the first gate terminal in order to drive the transistor between the switching states, wherein the gate driver circuit is configured to trigger a first transition of the first gate voltage from a first voltage level to a second voltage level during each of the plurality of switching events at a first trigger time, wherein the second voltage level is less than the first voltage level,
wherein the gate driver circuit is configured to control a second gate voltage at the second gate terminal in order to drive the gate-controlled freewheeling diode between conduction states, wherein the gate driver circuit is configured to trigger a second transition of the second gate voltage from a third voltage level to a fourth voltage level during each of the plurality of switching events at a second trigger time, wherein the fourth voltage level is greater than the third voltage level, and wherein the second trigger time is offset prior to the first trigger time by a desaturation time;
a measurement circuit configured to measure a transistor parameter indicative of a voltage slew rate of the transistor for a first turn-off switching event during which the transistor is transitioned from an on state to an off state; and a control circuit configured to receive the measured transistor parameter and regulate a duration of the desaturation time based on the measured transistor parameter.

18. The gate driver system of embodiment 17, wherein, during the desaturation time, charge carrier concentrations of electrons and holes within the gate-controlled freewheeling diode are reduced.

19. The gate driver system of any of embodiments 17 and 18, wherein the control circuit is configured to compare the measured transistor parameter to a threshold value to generate a comparison result and regulate the duration of the desaturation time for a next turn-off switching event of the transistor based on the comparison result.

20. The gate driver system of any of embodiments 17-19, wherein the control circuit is configured to adjust the second trigger time based on the comparison result.

21. The gate driver system of any of embodiments 17-20, wherein:

on a first condition that the measured transistor parameter exceeds the threshold value, the control circuit is configured to decrease the duration of the desaturation time for the next turn-off switching event, and on a second condition that the measured transistor parameter does not exceed the threshold value, the control circuit is configured to increase the duration of the desaturation time for the next turn-off switching event.

22. The gate driver system of any of embodiments 17-21, wherein the measurement circuit is configured to measure the transistor parameter for the first turn-off switching event while a load current is flowing through the gate-controlled freewheeling diode.

23. The gate driver system of any of embodiments 17-22, wherein the measurement circuit comprises a current direction measurement configured to detect a current direction of the load current and determine when the load current is flowing through the gate-controlled freewheeling diode based on the detected current direction.

24. A gate driver system, comprising:

a half bridge circuit comprising a first transistor and a second transistor, wherein the first transistor is configured to be turned on and the second transistor is configured to be turned off during each of a plurality of switching events;

a gate-controlled freewheeling diode coupled antiparallel to the second transistor, wherein the gate-controlled freewheeling diode is configured to be turned on during each of the plurality of switching events;

a gate driver circuit coupled to a first gate terminal of the second transistor and to a second gate terminal of the gate-controlled freewheeling diode, wherein the gate driver circuit is configured to control a first gate voltage at the first gate terminal in order to drive the second transistor between the switching states, wherein the gate driver circuit is configured to trigger a first transition of the first gate voltage from a first voltage level to a second voltage level during each of the plurality of switching events at a first trigger time, wherein the second voltage level is less than the first voltage level, wherein the gate driver circuit is configured to control a second gate voltage at the second gate terminal in order to drive the gate-controlled freewheeling diode between conduction states, wherein the gate driver circuit is configured to trigger a second transition of the second gate voltage from a third voltage level to a fourth voltage level during each of the plurality of switching events at a second trigger time, wherein the fourth voltage level is greater than the third voltage level, and wherein the second trigger time is offset prior to the first trigger time by a desaturation time;

a measurement circuit configured to measure a transistor parameter indicative of a voltage slew rate of the first transistor for a first switching event during which the first transistor is transitioned from an off state to an on state; and a control circuit configured to receive the measured transistor parameter and regulate a duration of the desaturation time based on the measured transistor parameter.

25. A method of driving a transistor between switching states, the method comprising: controlling a transition of a gate voltage at a gate terminal of a transistor during each of a plurality of turn-off switching events to turn off the transistor, wherein the transistor is configured to be turned off according to a desaturation time during each of the plurality of turn-off switching events; measuring a transistor parameter indicative of a voltage slew rate of the transistor for a first turn-off switching event during which the transistor is transitioned from an on state to an off state; and regulating a duration of the desaturation time for a next turn-off switching event based on the measured transistor parameter.

While various embodiments have been disclosed, it will be apparent to those skilled in the art that various changes and modifications can be made which will achieve some of the advantages of the concepts disclosed herein without departing from the spirit and scope of the invention. For example, the measurement and control schemes may be applied to an MOS-gated device for regulating a duration of a desaturation time of the MOS-gated device. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A gate driver system, comprising:
a transistor configured to be driven between switching states;
a gate driver circuit coupled to a gate terminal of the transistor and configured to control a gate voltage at the gate terminal in order to drive the transistor between the switching states, wherein the gate driver circuit is configured to generate a gate control signal that controls the gate voltage during each of a plurality of turn-off switching events to turn off the transistor, wherein the transistor is configured to be turned off according to a desaturation time during each of the plurality of turn-off switching events;
a measurement circuit configured to measure a transistor parameter indicative of a voltage slew rate of the transistor for a first turn-off switching event during which the transistor is transitioned from an on state to an off state; and
a control circuit configured to receive the measured transistor parameter and regulate a duration of the desaturation time based on the measured transistor parameter.

2. The gate driver system of claim 1, wherein the transistor comprises a first load terminal and a second load terminal, and the voltage slew rate corresponds to a voltage across the first load terminal and the second load terminal.

3. The gate driver system of claim 1, wherein the transistor parameter is proportional to the voltage slew rate.

4. The gate driver system of claim 1, wherein the transistor parameter is a function of the voltage slew rate measured over a predefined measurement interval.

5. The gate driver system of claim 1, wherein the transistor parameter corresponds to an operation point of the transistor that changes based on at least one operating condition of the transistor.

6. The gate driver system of claim 1, wherein, during the desaturation time, charge carrier concentrations of electrons and holes within the transistor are reduced.

7. The gate driver system of claim 1, wherein the control circuit is configured to compare the measured transistor parameter to a threshold value to generate a comparison result and regulate the duration of the desaturation time for a next turn-off switching event of the transistor based on the comparison result.

8. The gate driver system of claim 7, wherein:
on a first condition that the measured transistor parameter exceeds the threshold value, the control circuit is configured to decrease the duration of the desaturation time for the next turn-off switching event, and
on a second condition that the measured transistor parameter does not exceed the threshold value, the control circuit is configured to increase the duration of the desaturation time for the next turn-off switching event.

9. The gate driver system of claim 8, wherein:
on the first condition that the measured transistor parameter exceeds the threshold value, the control circuit is configured to decrease the duration of the desaturation time for the next turn-off switching event by a first predetermined amount, and
on the second condition that the measured transistor parameter does not exceed the threshold value, the control circuit is configured to increase the duration of the desaturation time for the next turn-off switching event by a second predetermined amount.

10. The gate driver system of claim 7, wherein the comparison result indicates whether or not the measured transistor parameter exceeds the threshold value at any point during the first turn-off switching event.

11. The gate driver system of claim 1, wherein:
the gate driver circuit is configured to transition the gate voltage from a first voltage level to a second voltage level during each of the plurality of turn-off switching events,
wherein the gate driver circuit further comprises a clamping circuit coupled to the gate terminal, wherein the clamping circuit is configured to clamp the gate voltage to a desaturation voltage level for the duration of the desaturation time, wherein the desaturation voltage level is between the first voltage level and the second voltage level.

12. The gate driver system of claim 11, wherein the desaturation voltage level is between the first voltage level and a turn-on/turn-off threshold voltage of the transistor.

13. The gate driver system of claim 11, wherein during the transition the gate voltage from the first voltage level to the second voltage level during each of the plurality of turn-off switching events, the clamping circuit is configured to clamp the gate voltage to the desaturation voltage level for the duration of the desaturation time when the gate voltage reaches the desaturation voltage level from the first voltage level.

14. The gate driver system of claim 11, wherein the clamping circuit is configured to permit the gate voltage to transition from the desaturation voltage level to the second voltage level upon expiration of the desaturation time.

15. The gate driver system of claim 1, wherein:
the gate driver circuit is configured to transition the gate voltage from a first voltage level to a second voltage level during each of the plurality of turn-off switching events,
the transistor comprises a first load terminal and a second load terminal, a load current configured to flow from the first load terminal to the second load terminal, and
the gate driver system further comprises:
a clamping circuit coupled to the first load terminal, wherein the clamping circuit is configured to clamp a terminal voltage of the first load terminal to a desaturation voltage level for the duration of the desaturation time.

16. The gate driver system of claim 1, wherein:
the transistor is a dual gate transistor comprising a control gate and the gate terminal as a switching gate,
the gate driver circuit is configured to trigger a transition of a gate voltage of the control gate from a first voltage level to a second voltage level during each of the plurality of turn-off switching events at a first trigger time, and the gate driver circuit is configured to trigger a transition of a gate voltage of the switching gate from a third voltage level to a fourth voltage level during each of the plurality of turn-off switching events at a second trigger time that is offset subsequent to the first trigger time by the duration of the desaturation time.

17. A gate driver system, comprising:
a transistor configured to be driven between switching states wherein the transistor is configured to be turned off during each of a plurality of switching events;
a gate-controlled freewheeling diode coupled antiparallel to the transistor, wherein the gate-controlled freewheeling diode is configured to be turned on during each of the plurality of switching events;
a gate driver circuit coupled to a first gate terminal of the transistor and to a second gate terminal of the gate-controlled freewheeling diode,
wherein the gate driver circuit is configured to control a first gate voltage at the first gate terminal in order to drive the transistor between the switching states, wherein the gate driver circuit is configured to trigger a first transition of the first gate voltage from a first voltage level to a second voltage level during each of the plurality of switching events at a first trigger time, wherein the second voltage level is less than the first voltage level,
wherein the gate driver circuit is configured to control a second gate voltage at the second gate terminal in order to drive the gate-controlled freewheeling diode between conduction states, wherein the gate driver circuit is configured to trigger a second transition of the second gate voltage from a third voltage level to a fourth voltage level during each of the plurality of switching events at a second trigger time, wherein the fourth voltage level is greater than the third voltage level, and wherein the second trigger time is offset prior to the first trigger time by a desaturation time;
a measurement circuit configured to measure a transistor parameter indicative of a voltage slew rate of the transistor for a first turn-off switching event during which the transistor is transitioned from an on state to an off state; and
a control circuit configured to receive the measured transistor parameter and regulate a duration of the desaturation time based on the measured transistor parameter.

18. The gate driver system of claim 17, wherein, during the desaturation time, charge carrier concentrations of electrons and holes within the gate-controlled freewheeling diode are reduced.

19. The gate driver system of claim 17, wherein the control circuit is configured to compare the measured transistor parameter to a threshold value to generate a comparison result and regulate the duration of the desaturation time for a next turn-off switching event of the transistor based on the comparison result.

20. The gate driver system of claim 19, wherein the control circuit is configured to adjust the second trigger time based on the comparison result.

21. The gate driver system of claim 19, wherein:
on a first condition that the measured transistor parameter exceeds the threshold value, the control circuit is configured to decrease the duration of the desaturation time for the next turn-off switching event, and on a second condition that the measured transistor parameter does not exceed the threshold value, the control circuit is configured to increase the duration of the desaturation time for the next turn-off switching event.

22. The gate driver system of claim 17, wherein the measurement circuit is configured to measure the transistor parameter for the first turn-off switching event while a load current is flowing through the gate-controlled freewheeling diode.

23. The gate driver system of claim 22, wherein the measurement circuit comprises a current direction measurement configured to detect a current direction of the load current and determine when the load current is flowing through the gate-controlled freewheeling diode based on the detected current direction.

24. A gate driver system, comprising:
a half bridge circuit comprising a first transistor and a second transistor, wherein the first transistor is configured to be turned on and the second transistor is configured to be turned off during each of a plurality of switching events;
a gate-controlled freewheeling diode coupled antiparallel to the second transistor, wherein the gate-controlled freewheeling diode is configured to be turned on during each of the plurality of switching events;
a gate driver circuit coupled to a first gate terminal of the second transistor and to a second gate terminal of the gate-controlled freewheeling diode,
wherein the gate driver circuit is configured to control a first gate voltage at the first gate terminal in order to drive the second transistor between the switching states, wherein the gate driver circuit is configured to trigger a first transition of the first gate voltage from a first voltage level to a second voltage level during each of the plurality of switching events at a first trigger time, wherein the second voltage level is less than the first voltage level,
wherein the gate driver circuit is configured to control a second gate voltage at the second gate terminal in order to drive the gate-controlled freewheeling diode between conduction states, wherein the gate driver circuit is configured to trigger a second transition of the second gate voltage from a third voltage level to a fourth voltage level during each of the plurality of switching events at a second trigger time, wherein the fourth voltage level is greater than the third voltage level, and wherein the second trigger time is offset prior to the first trigger time by a desaturation time;
a measurement circuit configured to measure a transistor parameter indicative of a voltage slew rate of the first transistor for a first switching event during which the first transistor is transitioned from an off state to an on state; and
a control circuit configured to receive the measured transistor parameter and regulate a duration of the desaturation time based on the measured transistor parameter.

25. A method of driving a transistor between switching states, the method comprising:
controlling a transition of a gate voltage at a gate terminal of a transistor during each of a plurality of turn-off switching events to turn off the transistor, wherein the transistor is configured to be turned off according to a desaturation time during each of the plurality of turn-off switching events;
measuring a transistor parameter indicative of a voltage slew rate of the transistor for a first turn-off switching event during which the transistor is transitioned from an on state to an off state; and regulating a duration of the desaturation time for a next turn-off switching event based on the measured transistor parameter.

* * * * *